(12) United States Patent
Xue et al.

(10) Patent No.: US 10,770,002 B2
(45) Date of Patent: Sep. 8, 2020

(54) SHIFT REGISTER CIRCUIT, DRIVING METHOD THEREOF, GATE DRIVER AND DISPLAY PANEL

(71) Applicants: BOE Technology Group Co., Ltd., Beijing (CN); HEFEI BOE OPTOELECTRONICS TECHNOLOGY CO., LTD., Hefei, Anhui (CN)

(72) Inventors: Wei Xue, Beijing (CN); Hongmin Li, Beijing (CN); Zhifu Dong, Beijing (CN); Fengjing Tang, Beijing (CN)

(73) Assignees: BOE TECHNOLOGY GROUP CO., LTD., Beijing (CN); HEFEI BOE OPTOELECTRONICS TECHNOLOGY CO., LTD., Hefei (CN)

( * ) Notice: Subject to any disclaimer, the term of this patent is extended or adjusted under 35 U.S.C. 154(b) by 201 days.

(21) Appl. No.: 16/134,472

(22) Filed: Sep. 18, 2018

(65) Prior Publication Data
US 2019/0221163 A1  Jul. 18, 2019

(30) Foreign Application Priority Data
Jan. 18, 2018  (CN) .......................... 2018 1 0048904

(51) Int. Cl.
*G11C 19/00* (2006.01)
*G09G 3/3266* (2016.01)
(Continued)

(52) U.S. Cl.
CPC ......... *G09G 3/3266* (2013.01); *G09G 3/3677* (2013.01); *G11C 19/28* (2013.01);
(Continued)

(58) Field of Classification Search
None
See application file for complete search history.

(56) References Cited

U.S. PATENT DOCUMENTS 8,902,145 B2  12/2014  Umezaki et al.
2005/0264514 A1*  12/2005  Kim .................. G11C 19/00
                                         345/100
(Continued)

FOREIGN PATENT DOCUMENTS

CN  1705042 A  12/2005
CN  102654681 B  9/2012
(Continued)

OTHER PUBLICATIONS

First Office Action and English language translation, CN Application No. 201810048904.X, Apr. 13, 2020, 27 pp.

*Primary Examiner* — Tuan T Lam
(74) *Attorney, Agent, or Firm* — Myers Bigel, P.A.

(57) ABSTRACT

A shift register circuit includes an input terminal, a reset terminal, a first scan voltage terminal, a second scan voltage terminal, a first reference voltage terminal, a second reference voltage terminal, a clock terminal, an output terminal, an input circuit, a first control circuit, a second control circuit, and an output circuit. The first control circuit is configured to supply a second reference voltage applied at the second reference voltage terminal to a first node and bring the second reference voltage terminal into conduction with the output terminal in response to a second node being at an active potential. The second control circuit is configured to supply a first reference voltage applied at the first reference voltage terminal to the first node and bring the first reference voltage terminal into conduction with the output terminal in response to a third node being at an active potential.

20 Claims, 6 Drawing Sheets

(51) Int. Cl.
*G09G 3/36* (2006.01)
*G11C 19/28* (2006.01)

(52) U.S. Cl.
CPC ... *G11C 19/287* (2013.01); *G09G 2310/0286* (2013.01); *G09G 2310/061* (2013.01); *G09G 2310/08* (2013.01); *G09G 2320/045* (2013.01)

(56) References Cited

U.S. PATENT DOCUMENTS

| | | | |
|---|---|---|---|
| 2006/0290390 A1* | 12/2006 | Jang | G11C 19/28 327/112 |
| 2011/0002438 A1* | 1/2011 | Kim | G11C 19/28 377/67 |
| 2015/0002504 A1* | 1/2015 | Jo | G09G 3/3677 345/213 |
| 2017/0270851 A1* | 9/2017 | Shang | G11C 19/28 |
| 2017/0270892 A1* | 9/2017 | Wang | G09G 5/003 |
| 2018/0190232 A1* | 7/2018 | Xue | G09G 3/3677 |
| 2018/0204494 A1* | 7/2018 | Shang | G11C 19/28 |
| 2018/0301075 A1* | 10/2018 | Zhou | G09G 3/20 |
| 2018/0342187 A1* | 11/2018 | Shan | G09G 3/20 |
| 2019/0066559 A1* | 2/2019 | Wang | G09G 3/20 |
| 2019/0066568 A1* | 2/2019 | Wu | G11C 19/184 |
| 2019/0147819 A1* | 5/2019 | Lv | G09G 3/3677 345/208 |
| 2019/0213970 A1* | 7/2019 | Wang | G09G 3/20 |
| 2019/0236995 A1* | 8/2019 | Du | G11C 19/28 |

FOREIGN PATENT DOCUMENTS

| | | |
|---|---|---|
| CN | 104252853 A | 12/2014 |
| CN | 105185349 A | 12/2015 |

* cited by examiner

SHIFT REGISTER CIRCUIT, DRIVING METHOD THEREOF, GATE DRIVER AND DISPLAY PANEL

CROSS-REFERENCE TO RELATED APPLICATIONS

The present application claims the priority of Chinese Patent Application No. 201810048904.X, filed on Jan. 18, 2018, the entire disclosure of which is incorporated herein by reference.

TECHNICAL FIELD

The present disclosure relates to generation of gate drive signals, and more particularly to a shift register circuit, a driving method thereof, a gate driver, a display panel, and a display device.

BACKGROUND

A gate driver that includes a plurality of cascaded shift register units is operable to generate and supply gate drive signals to a pixel array of a display panel. In certain existing gate drivers, one or more of the transistors in the shift register unit may be in a direct current (DC) biased state during operation, resulting in a threshold voltage drift and a reduced lifetime of the transistor. This may further cause anomalies in the generated gate drive signal.

SUMMARY

According to an aspect of the present disclosure, a shift register circuit is provided comprising: an input terminal operable to receive an input pulse; a reset terminal operable to receive a reset pulse; a first scan voltage terminal operable to be applied with a first scan voltage; a second scan voltage terminal operable to be applied with a second scan voltage; a first reference voltage terminal operable to be applied with a first reference voltage; a second reference voltage terminal operable to be applied with a second reference voltage; a clock terminal operable to receive a clock signal; an output terminal operable to output an output signal; an input circuit configured to supply the first scan voltage applied at the first scan voltage terminal to a first node in response to the input pulse received at the input terminal being active, and to supply the second scan voltage applied at the second scan voltage terminal to the first node in response to the reset pulse received at the reset terminal being active; a first control circuit configured to bring the first reference voltage terminal into conduction with a second node in response to the first reference voltage applied at the first reference voltage terminal being active, to bring the second reference voltage terminal into conduction with the second node in response to the first node being at an active potential, and to supply the second reference voltage applied at the second reference voltage terminal to the first node and bring the second reference voltage terminal into conduction with the output terminal in response to the second node being at an active potential; a second control circuit configured to bring the second reference voltage terminal into conduction with a third node in response to the second reference voltage applied at the second reference voltage terminal being active, to bring the first reference voltage terminal into conduction with the third node in response to the first node being at an active potential, and to supply the first reference voltage applied at the first reference voltage terminal to the first node and bring the first reference voltage terminal into conduction with the output terminal in response to the third node being at an active potential; and an output circuit configured to bring the clock terminal into conduction with the output terminal in response to the first node being at an active potential.

In some exemplary embodiments, the first control circuit and the second control circuit are configured to operate alternatingly in response to each of the first reference voltage and the second reference voltage switching between an active voltage level and an inactive voltage level at an interval. The first reference voltage and the second reference voltage have opposite phases.

In some exemplary embodiments, the input circuit comprises: a first transistor having a gate connected to the input terminal, a first electrode connected to the first scan voltage terminal, and a second electrode connected to the first node; and a second transistor having a gate connected to the reset terminal, a first electrode connected to the second scan voltage terminal, and a second electrode connected to the first node.

In some exemplary embodiments, the first control circuit comprises: a fourth transistor having a gate connected to the second node, a first electrode connected to the second reference voltage terminal, and a second electrode connected to the output terminal; a sixth transistor having a gate connected to the first reference voltage terminal, a first electrode connected to the first reference voltage terminal, and a second electrode connected to the second node; a seventh transistor having a gate connected to the first node, a first electrode connected to the second reference voltage terminal, and a second electrode connected to the second node; and an eighth transistor having a gate connected to the second node, a first electrode connected to the second reference voltage terminal, and a second electrode connected to the first node.

In some exemplary embodiments, the second control circuit comprises: a fifth transistor having a gate connected to the third node, a first electrode connected to the first reference voltage terminal, and a second electrode connected to the output terminal; a ninth transistor having a gate connected to the second reference voltage terminal, a first electrode connected to the second reference voltage terminal, and a second electrode connected to the third node; a tenth transistor having a gate connected to the first node, a first electrode connected to the first reference voltage terminal, and a second electrode connected to the third node; and an eleventh transistor having a gate connected to the third node, a first electrode connected to the first reference voltage terminal, and a second electrode connected to the first node.

In some exemplary embodiments, the output circuit comprises a third transistor having a gate connected to the first node, a first electrode connected to the clock terminal, and a second electrode connected to the output terminal. In some exemplary embodiments, the output circuit further comprises a capacitor connected between the first node and the output terminal.

According to another aspect of the present disclosure, a gate driver is provided comprising N cascaded shift register circuits as described above, N being an integer greater than or equal to 2. The output terminal of an m-th one of the N shift register circuits is connected to the input terminal of an (m+1)-th one of the N shift register circuits, m being an integer and $1 \leq m < N$. The output terminal of an n-th one of the N shift register circuits is connected to the reset terminal of an (n−1)-th one of the N shift register circuits, n being an integer and 1<n≤N.

According to yet another aspect of the present disclosure, a display panel is provided comprising: a first scan voltage line operable to transfer a first scan voltage; a second scan voltage line operable to transfer a second scan voltage; a first reference voltage line operable to transfer a first reference voltage, the first reference voltage switching between an active voltage level and an inactive voltage level at an interval; a second reference voltage line operable to transfer a second reference voltage, the second reference voltage switching between an active voltage level and an inactive voltage level at the interval, the first and second reference voltages having opposite phases; a first clock line operable to transfer a first clock signal; a second clock line operable to transfer a second clock signal, the first and second clock signals having opposite phases; and the gate driver as described above. The first scan voltage terminals of the N shift register circuits are connected to the first scan voltage line. The second scan voltage terminals of the N shift register circuits are connected to the second scan voltage line. The first reference voltage terminals of the N shift register circuits are connected to the first reference voltage line. The second reference voltage terminals of the N shift register circuits are connected to the second reference voltage line. The clock terminal of a (2k−1)-th one of the N shift register circuits is connected to the first clock line. The clock terminal of a 2k-th one of the N shift register circuits is connected to the second clock line, k being a positive integer and 2k≤N.

According to still yet another aspect of the present disclosure, a display device is provided comprising: the display panel as described above; a timing controller configured to control operation of the display panel, wherein the timing controller is configured to supply the first clock signal and the second clock signal to the first clock line and the second clock line, respectively; a voltage generator configured to, under control of the timing controller, supply the first scan voltage, the second scan voltage, the first reference voltage, and the second reference voltage to the first scan voltage line, the second scan voltage line, the first reference voltage line, and the second reference voltage line, respectively.

According to a further aspect of the present disclosure, a method of driving the shift register circuit as described above is provided. The method comprises: supplying the first reference voltage to the first reference voltage terminal, wherein the first reference voltage switches between an active voltage level and an inactive voltage level at an interval; supplying the second reference voltage to the second reference voltage terminal, wherein the second reference voltage switches between an active voltage level and an inactive voltage level at the interval, the first and second reference voltages having opposite phases; and depending on whether the first reference voltage or the second reference voltage is active, selectively performing, by the first control circuit and the second control circuit, operations comprising: (a) responsive to the first reference voltage being active, bringing, by the first control circuit, the first reference voltage terminal into conduction with the second node, supplying the second reference voltage to the first node, and bringing the second reference voltage terminal into conduction with the output terminal; or (b) responsive to the second reference voltage being active, bringing, by the second control circuit, the second reference voltage terminal into conduction with the third node, supplying the first reference voltage to the first node, and bringing the first reference voltage terminal into conduction with the output terminal.

In some exemplary embodiments, the first scan voltage has an active voltage level, and the second scan voltage has an inactive voltage level. The method further comprises: supplying the input pulse to the input terminal such that the input circuit supplies the first scan voltage to the first node in response to the input pulse being active; bringing, by the first control circuit, the second reference voltage terminal into conduction with the second node in response to the first node being at an active potential; bringing, by the second control circuit, the first reference voltage terminal into conduction with the third node in response to the first node being at an active potential; bringing, by the output circuit, the clock terminal into conduction with the output terminal in response to the first node being at an active potential; and supplying the reset pulse to the reset terminal such that the input circuit supplies the second scan voltage to the first node in response to the reset pulse being active.

In some exemplary embodiments, the first scan voltage has an inactive voltage level, and the second scan voltage has an active voltage level. The method further comprises: supplying the input pulse to the reset terminal such that the input circuit supplies the second scan voltage to the first node in response to the input pulse being active; bringing, by the first control circuit, the second reference voltage terminal into conduction with the second node in response to the first node being at an active potential; bringing, by the second control circuit, the first reference voltage terminal into conduction with the third node in response to the first node being at an active potential; bringing, by the output circuit, the clock terminal into conduction with the output terminal in response to the first node being at an active potential; and supplying the reset pulse to the input terminal such that the input circuit supplies the first scan voltage to the first node in response to the reset pulse being active.

In some exemplary embodiments, the clock signal has a duty cycle of 50%. The input pulse has a pulse width equal to a half of a period of the clock signal and is in synchronization with a duration in which the clock signal is inactive. The reset pulse has a pulse width equal to a half of the period of the clock signal and is delayed by one period of the clock signal relative to the input pulse.

These and other aspects of the present disclosure will be apparent from and elucidated with reference to the embodiment(s) described hereinafter.

DETAILED DESCRIPTION

It will be understood that, although the terms first, second, third etc. may be used herein to describe various elements, components and/or sections, these elements, components and/or sections should not be limited by these terms. These terms are only used to distinguish one element, component or section from another. Thus, a first element, component or section discussed below could be termed a second element, component or section without departing from the teachings of the present disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element is referred to as being "connected to" or "coupled to" another element, it can be directly connected or coupled to the other element, or intervening elements may be present. In contrast, when an element is referred to as being "directly connected to" or "directly coupled to" another element, there are no intervening elements present.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 1:
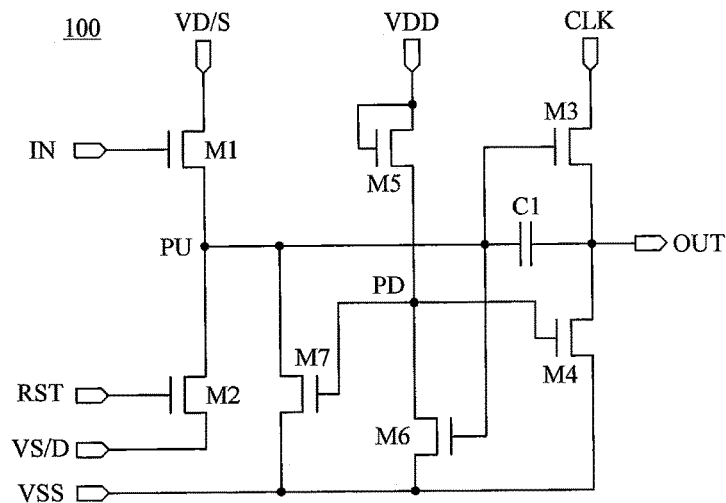
FIG. 1 is a circuit diagram of a typical shift register circuit.

FIG. 1 is a circuit diagram of a typical shift register circuit 100. As shown in FIG. 1, the shift register circuit 100 includes transistors M1 to M7, internal nodes PU and PD, and a capacitor C1. The shift register circuit 100 is connected to an input terminal IN, a reset terminal RST, a first scan voltage terminal VD/S, a second scan voltage terminal VS/D, a first reference voltage terminal VDD, a second reference voltage terminal VSS, a clock terminal CLK, and an output terminal OUT.

Figure 2:
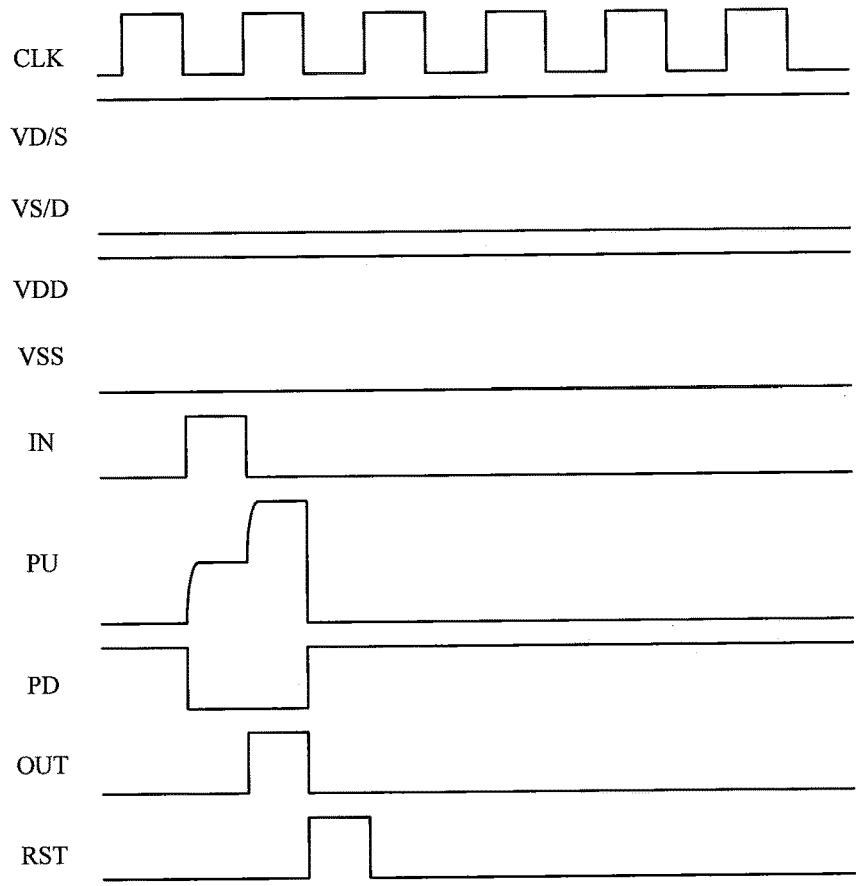
FIG. 2 is a timing diagram for the shift register circuit shown in FIG. 1.

FIG. 2 shows an example timing diagram for the shift register circuit 100. As shown in FIG. 2, an output signal at the output terminal OUT is "shifted" by half a clock period relative to an input signal at the input terminal IN. In particular, during operation of the shift register 100, the first reference voltage terminal VDD is always at a high voltage level such that the transistor M5 is always in a DC biased state. This may result in a threshold voltage drift and a shortened lifetime of the transistor M5. This may further lead to an abnormality of the output signal at the output terminal OUT.

Figure 3:
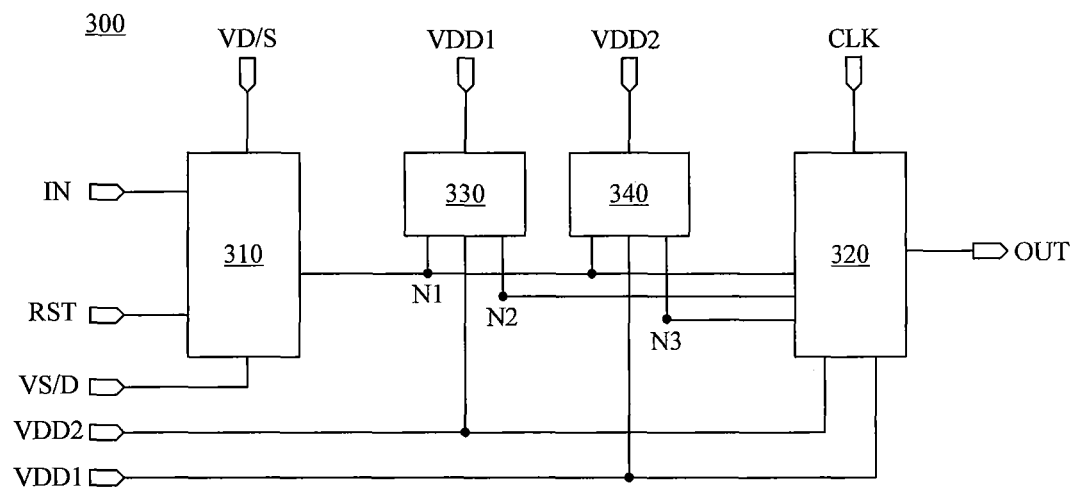
FIG. 3 is a schematic block diagram of a shift register circuit in accordance with an embodiment of the present disclosure.

FIG. 3 is a block diagram of a shift register circuit 300 in accordance with an embodiment of the present disclosure. Referring to FIG. 3, the shift register circuit 300 includes an input terminal IN operable to receive an input pulse, a reset terminal RST operable to receive a reset pulse, a first scan voltage terminal VD/S operable to be applied with a first scan voltage, a second scan voltage terminal VS/D operable to be applied with a second scan voltage, a first reference voltage terminal VDD1 operable to be applied with a first reference voltage, a second reference voltage terminal VDD2 operable to be applied a second the reference voltage, a clock terminal CLK operable to receive a clock signal, and an output terminal OUT operable to output an output signal. The shift register circuit 300 further includes an input circuit 310, an output circuit 320, a first control circuit 330, and a second control circuit 340, which are illustrated as blocks.

The input circuit 310 is configured to supply the first scan voltage applied at the first scan voltage terminal VD/S to a first node N1 in response to the input pulse received at the input terminal IN being active. The input circuit 310 is further configured to supply the second scan voltage applied at the second scan voltage terminal VS/D to the first node N1 in response to the reset pulse received at the reset terminal RST being active.

The first control circuit 330 is configured to bring the first reference voltage terminal VDD1 into conduction with the second node N2 in response to the first reference voltage applied to the first reference voltage terminal VDD1 being active. The first control circuit 330 is further configured to bring the second reference voltage terminal VDD2 into conduction with the second node N2 in response to the first node N1 being at an active potential. The first control circuit 330 is further configured to supply the second reference voltage applied at the second reference voltage terminal VDD2 to the first node N1 and bring the second reference voltage terminal VDD2 into conduction with the output terminal OUT in response to the second node N2 being at an active potential.

The second control circuit 340 is configured to bring the second reference voltage terminal VDD2 into conduction with the third node N3 in response to the second reference voltage applied at the second reference voltage terminal VDD2 being active. The second control circuit 340 is further configured to bring the first reference voltage terminal VDD1 into conduction with the third node N3 in response to the first node N1 being at an active potential. The second control circuit 340 is further configured to supply the first reference voltage applied at the first reference voltage terminal VDD1 to the first node N1 and bring the first reference voltage terminal VDD1 into conduction with the output terminal OUT in response to the third node N3 being at an active potential.

The output circuit 320 is configured to bring the clock terminal CLK into conduction with the output terminal OUT in response to the first node N1 being at an active potential.

The term "active potential" as used herein refers to a potential at which the circuit element (e.g., a transistor) involved is enabled, and the term "inactive potential" as used herein refers to a potential at which the circuit element involved is disabled. For an n-type transistor, the active potential is high and the inactive potential is low. For a p-type transistor, the active potential is low and the inactive potential is high. It will be understood that the active potential or the inactive potential is not intended to refer to a particular potential, but may include a range of potentials. Additionally, the term "voltage level" is intended to be used interchangeably with "potential."

In this embodiment, the first control circuit 330 and the second control circuit 340 can be configured to operate in an alternating manner. This may be achieved by causing each of the first reference voltage supplied to the first reference voltage terminal VDD1 and the second reference voltage supplied to the second reference voltage terminal VDD2 to switch between an active voltage level and an inactive voltage level at an interval. In particular, the first and second reference voltages have opposite phases. That is, when the second reference voltage is inactive, the first reference voltage is active, and vice versa. By doing so, the shift register circuit 300 can operate with high reliability. This is because some or even all of the circuit elements of the control circuit 330 or 340 are allowed to operate intermittently, rather than always being in a DC biased state during operation of the shift register circuit 300, thereby making it possible to maintain stable the characteristic parameters of these circuit elements and ultimately extend their lifespan.

Figure 4:
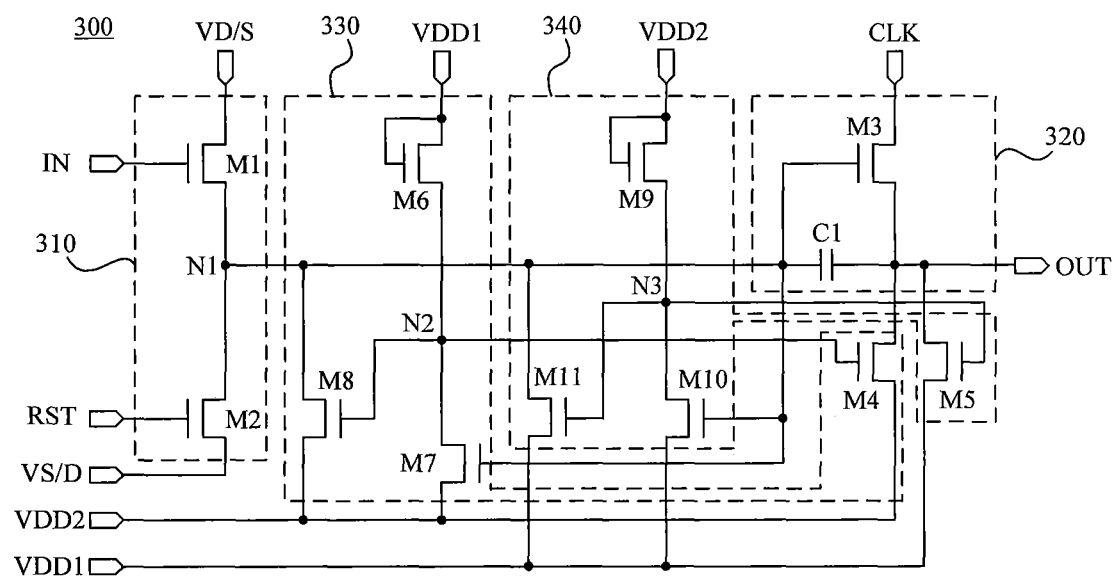
FIG. 4 is a circuit diagram of an example circuit of the shift register circuit shown in FIG. 3.

FIG. 4 is a circuit diagram of an example circuit of the shift register circuit 300 shown in FIG. 3. An example configuration of the shift register circuit 300 will be described below with reference to FIG. 4.

The input circuit 310 includes a first transistor M1 and a second transistor M2. The first transistor M1 has a gate connected to the input terminal IN, a first electrode connected to the first scan voltage terminal VD/S, and a second electrode connected to the first node N1. The second transistor M2 has a gate connected to the reset terminal RST, a first electrode connected to the second scan voltage terminal VS/D, and a second electrode connected to the first node N1.

The output circuit 320 includes a third transistor M3. The third transistor M3 has a gate connected to the first node N1, a first electrode connected to the clock terminal CLK, and a second electrode connected to the output terminal OUT. The output circuit 320 further optionally includes a capacitor C1 connected between the first node N1 and the output terminal OUT. The presence of the capacitor C1 may be advantageous in that the potential at the first node N1 can advantageously be maintained definite by means of the bootstrap effect of the capacitor C1, as will be described later.

The first control circuit 330 includes a fourth transistor M4, a sixth transistor M6, a seventh transistor M7, and an eighth transistor M8. The fourth transistor M4 has a gate connected to the second node N2, a first electrode connected to the second reference voltage terminal VDD2, and a second electrode connected to the output terminal OUT. The sixth transistor M6 has a gate connected to the first reference voltage terminal VDD1, a first electrode connected to the first reference voltage terminal VDD1, and a second electrode connected to the second node N2. The seventh transistor M7 has a gate connected to the first node N1, a first electrode connected to the second reference voltage terminal VDD2, and a second electrode connected to the second node N2. The eighth transistor M8 has a gate connected to the second node N2, a first electrode connected to the second reference voltage terminal VDD2, and a second electrode connected to the first node N1.

The second control circuit 340 includes a fifth transistor M5, a ninth transistor M9, a tenth transistor M10, and an eleventh transistor M11. The fifth transistor M5 has a gate connected to the third node N3, a first electrode connected to the first reference voltage terminal VDD1, and a second electrode connected to the output terminal OUT. The ninth transistor M9 has a gate connected to the second reference voltage terminal VDD2, a first electrode connected to the second reference voltage terminal VDD2, and a second electrode connected to the third node N3. The tenth transistor M10 has a gate connected to the first node N1, a first electrode connected to the first reference voltage terminal VDD1, and a second electrode connected to the third node N3. The eleventh transistor M11 has a gate connected to the third node N3, a first electrode connected to the first reference voltage terminal VDD1, and a second electrode connected to the first node N1.

In this embodiment, although the transistor are illustrated and described as n-type transistors, p-type transistors are possible. In the case of a p-type transistor, the gate-on voltage has a low level, and the gate-off voltage has a high level. In embodiments, the transistors may take the form of, for example, thin film transistors, which are typically fabricated such that their first and second electrodes can be used interchangeably. Other embodiments are also contemplated.

Figure 5:
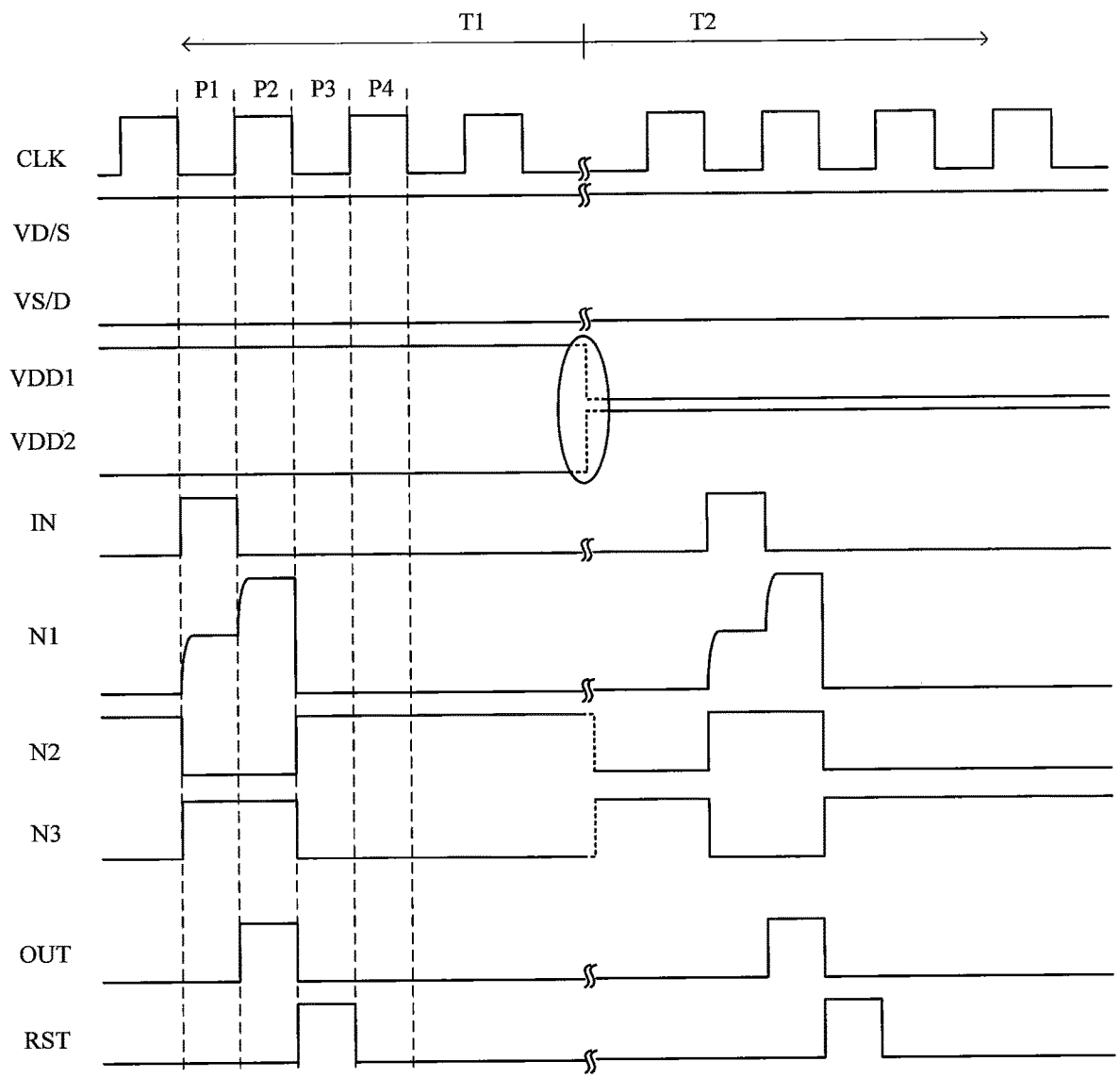
FIG. 5 is an example timing diagram for the example shift register circuit shown in FIG. 4.

FIG. 5 is an example timing diagram for the example shift register circuit 300 as shown in FIG. 4. For convenience of illustration, only two consecutive time intervals T1 and T2 are shown in FIG. 5. In this example, the voltage applied to the first reference voltage terminal VDD1 switches from a high level to a low level at a transition between the two time intervals, and the voltage applied to the second reference voltage terminal VDD2 switches from a low level to a high level at the transition, as indicated by the ellipse in FIG. 5. In FIG. 5, the clock signal received at the clock terminal CLK is shown to have a duty cycle of 50%, and the input pulse received at the input terminal IN is shown as having a pulse width equal to half the period of the clock signal and being in synchronized with the duration in which the clock signal is inactive. The reset pulse received at the reset terminal RST has a pulse width equal to half of the period of the clock signal and is delayed by one period of the clock signal with respect to the input pulse. It is also assumed in this example that the first scan voltage terminal VD/S and the second scan voltage terminal VS/D are applied with a high level voltage and a low level voltage, respectively.

The operation of the example circuit 300 shown in FIG. 4 is described below with reference to FIG. 5. Hereinafter, a high level is indicated by 1 and a low level is indicated by 0.

In a phase P1 of a time interval T1, IN=1, CLK=0, RST=0. Since IN=1, the first transistor M1 is turned on and the high-level voltage from the first scan voltage terminal VD/S is transferred to the first node N1, so that the first node N1 is set to an active potential. Accordingly, the third transistor M3, the seventh transistor M7, and the tenth transistor M10 are turned on. Since the first reference voltage terminal VDD1 is applied with a high level voltage, the sixth transistor M6 is turned on. Since the second reference voltage terminal VDD2 is applied with a low level voltage, the ninth transistor M9 is turned off. The sixth and seventh transistors M6 and M7 are designed to have such a width to length ratio (which determines the equivalent on-resistance of the transistor) that the second node N2 is set to an inactive potential in the case where both the sixth and seventh transistors M6 and M7 are turned on. The third node N3 is set to an active potential because it is brought into conduction with the first reference voltage terminal VDD1 via the turned-on tenth transistor M10, which terminal is applied with a high-level voltage. Accordingly, the fourth transistor M4 is turned off and the fifth transistor M5 is turned on. Although the clock terminal CLK is at an inactive potential and the first voltage terminal VDD1 is at an active potential, the third and fifth transistors M3 and M5 are designed to have such a width to length ratio that the output terminal OUT is set to an inactive potential in the case where both the third and fifth transistors M3 and M5 are turned on.

In a phase P2 of the time interval T1, IN=0, CLK=1, RST=0. Since IN=0 and RST=0, the first and second transistors M1 and M2 are turned off. The first node N1 is floated and still at an active potential such that the third transistor M3, the seventh transistor M7, and the tenth transistor M10 remain on. Since the first reference voltage terminal VDD1 and the second reference voltage terminal VDD2 are applied with the high level voltage and the low level voltage, respectively, the sixth transistor M6 remains on and the ninth transistor M9 remains off. Therefore, the second node N2 remains at the inactive potential and the third node N3 remains at the active potential. Accordingly, the fourth transistor M4 remains off and the fifth transistor M5 remains on. Since the clock terminal CLK is now at the active potential and the first voltage terminal VDD1 is at the active potential, the turned-on third and fifth transistors M3 and M5 cause the output terminal OUT to transition from the inactive potential of the phase P1 to the active potential. In particular, due to the bootstrap effect of the capacitor C1, the potential at the first node N1 transitions synchronously with the potential transition at the output terminal OUT, as shown in FIG. 5. This allows for a definite active potential at the first node N1, although the first node N1 is floated.

In a phase P3 of the time interval T1, IN=0, CLK=0, RST=1. Since RST=1, the second transistor M2 is turned on and the low-level voltage from the second scan voltage terminal VS/D is transferred to the first node N1, so that the first node N1 is reset to the inactive potential. Accordingly, the third transistor M3, the seventh transistor M7, and the tenth transistor M10 are turned off. Since the first reference voltage terminal VDD1 is applied with a high level voltage, the sixth transistor M6 remains on and sets the second node N2 to an active potential. Since the second reference voltage terminal VDD2 is applied with a low level voltage, the ninth transistor M9 is turned off, so that the third node N3 is floated (shown schematically in FIG. 5 as being at an inactive potential). Accordingly, the fourth transistor M4 is turned on and the fifth transistor M5 is turned off. The turned-on fourth transistor M4 transfers the low level voltage applied to the second reference voltage VDD2 to the output terminal OUT, causing the output terminal OUT to transition from the active potential of the phase P2 to the inactive potential.

In a phase P4 of the time interval T1 and the remaining time, the capacitor C1 keeps the first node N1 at an inactive potential. Accordingly, the third, seventh and tenth transistors remain off. The second node N2 remains at an active potential and the third node N3 remains floated. Therefore, the output terminal OUT remains at an inactive level.

Then, at the end of the time interval T1 and the beginning of a time interval T2, the voltage applied to the first reference voltage terminal VDD1 switches from a high level to a low level and the voltage applied to the second reference voltage terminal VDD2 switches from a low level to a high level. As a result, the operation of the first control circuit 330 and the operation of the second control circuit 340 are interchanged. As shown in FIG. 5, the voltage level of the second node N2 and the voltage level of the third node N3 are interchanged in the time interval T2 with respect to those in the time interval T1. Specifically, in the time interval T2, the first control circuit 330 performs the operation performed by the second control circuit 340 in the time interval T1, and the second control circuit 340 performs the operation performed by the first control circuit 330 in the time interval T1. The operation of the shift register circuit 300 in time interval T2 has not been described in detail here for the sake of brevity. In this manner, some of the circuit elements of the first and second control circuits 330 and 340 (for example, the sixth transistor M6 and the ninth transistor M9) are allowed to operate in an alternating manner, thereby making it possible to extend the lifespan of the shift register circuit as a whole.

Figure 6:
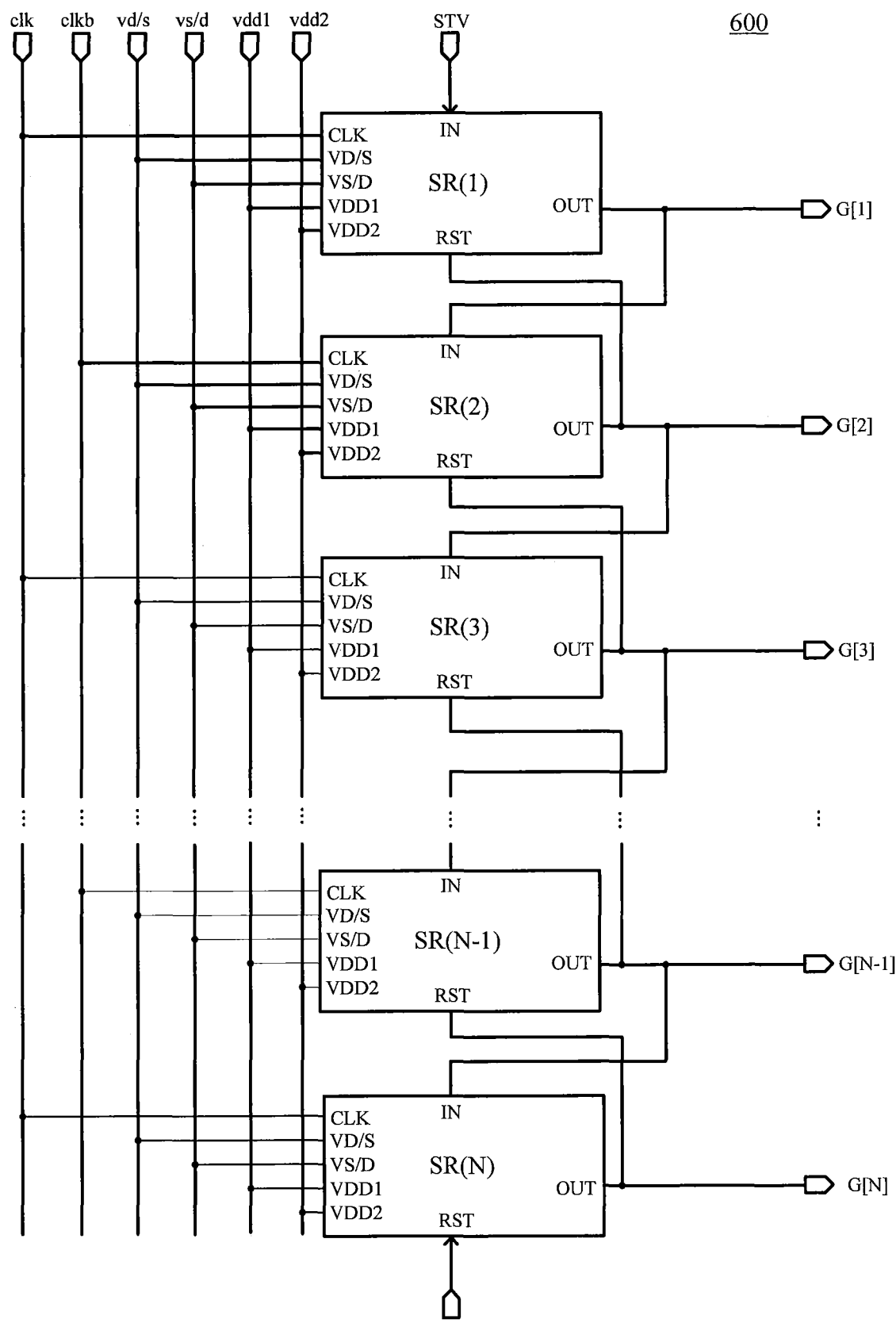
FIG. 6 is a block diagram of a gate driver in accordance with an embodiment of the present disclosure in a forward scan mode.
Figure 7:
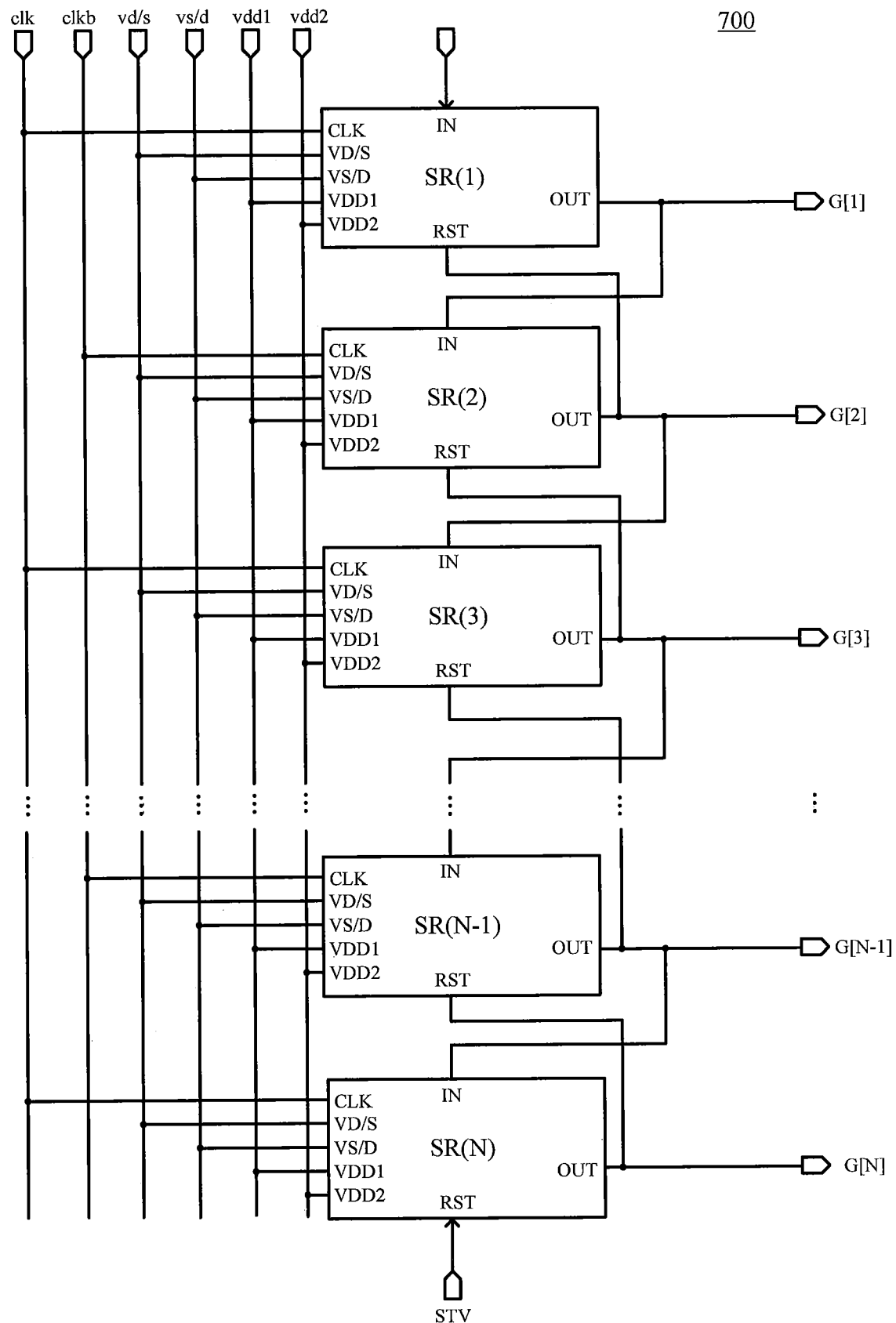
FIG. 7 is a block diagram of a gate driver in accordance with an embodiment of the present disclosure in a reverse scan mode.

FIGS. 6 and 7 are block diagrams of a gate driver in accordance with an embodiment of the present disclosure in a forward scan mode and a reverse scan mode, respectively.

Referring to FIGS. 6 and 7, the gate drivers 600 and 700 each include N cascaded shift register circuits SR(1), SR(2), SR(3), . . . , SR(N−1) and SR(N), each of which may take the form of the shift register circuit 300 as described above with respect to FIGS. 3 and 4. N may be an integer greater than or equal to 2. In the gate drivers 600 and 700, except for the first shift register circuit SR(1), the input terminal IN of each of the shift register circuits is connected to the output terminal OUT of the adjacent previous shift register circuit, and except for the N-th shift register circuit SR(N), the reset terminal RST of each of the shift register circuits is connected to the output terminal OUT of the adjacent next shift register circuit.

Depending on the scan mode, the input terminal IN and the reset terminal RST of each of the shift register circuits can be used interchangeably, and the first and second scan voltage terminals VD/S and VS/D of each of the shift register circuits can be used interchangeably. In the forward scan mode (FIG. 6), the first and second scan voltage terminals VD/S and VS/D are applied with an active level voltage and an inactive level voltage, respectively, and the input terminal IN of the first shift register circuit SR (1) receives a start signal STV as the input pulse. In the reverse scan mode (FIG. 7), the first and second scan voltage terminals VD/S and VS/D are applied with an inactive level voltage and an active level voltage, respectively, and the reset terminal RST of the N-th shift register circuit SR(N) receives the start signal STV as the input pulse. Therefore, in the reverse scan mode, the input terminal IN of each of the shift register circuits functions as a "reset terminal", and the reset terminal RST of each of the shift register circuits functions as an "input terminal".

The N shift register circuits SR(1), SR(2), SR(3), . . . , SR(N−1) and SR(N) in each of the gate drivers 600 and 700 can be connected to N gate lines G[1], G[2], G[3], . . . , G[N−1] and G[N], respectively. Each of the shift register circuits can further be connected to a first scan voltage line vd/s operable to transfer a first scan voltage, and a second scan voltage line vs/d operable to transfer a second scan voltage, a first reference voltage line vdd1 operable to transfer a first reference voltage, a second reference voltage line vdd2 operable to transfer a second reference voltage, a first clock line clk operable to transfer a first clock signal, and a second clock line clkb operable to transfer the second clock signal. The first and second clock signals have opposite phases. Specifically, the clock terminal CLK of the (2k−1)-th one of the shift register circuits SR(1), SR(2), SR(3), . . . , SR(N−1) and SR(N) is connected to the first clock line clk, and the clock terminal CLK of the 2k-th one of the shift register circuits SR(1), SR(2), SR(3), . . . , SR(N−1) and SR(N) is connected to the second clock line clkb, where k is a positive integer and 2k≤N. It will be understood that the first and second clock signals are supplied to the shift register circuits SR(1), SR(2), SR(3) . . . , SR(N−1) and SR(N) in such a manner that each of the shift register circuits operates with the same (but "time-shifted") timing to sequentially generate an output signal as a gate turn-on pulse.

As described above, the first and second reference voltages transferred by the first and second reference voltage lines vdd1 and vdd2 may switches between an active level and an inactive level at an interval, and the first and second reference voltages have opposite the phase. This can provide the advantages described earlier.

Figure 8:
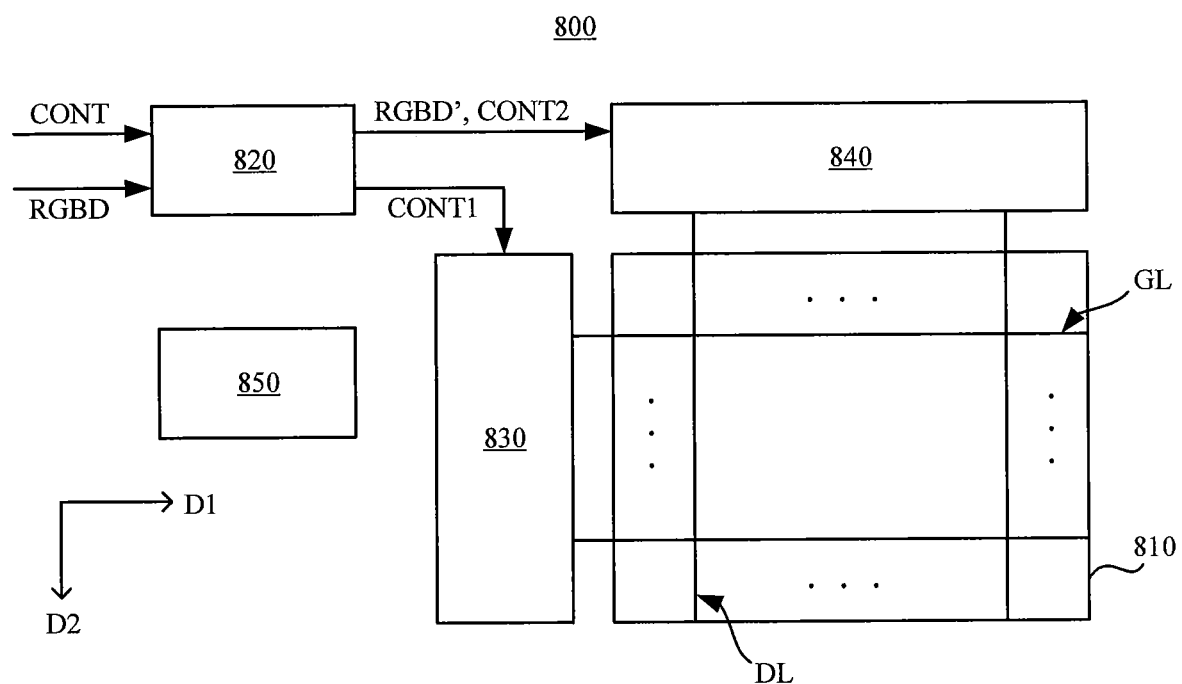
FIG. 8 is a block diagram of a display device in accordance with an embodiment of the present disclosure.

FIG. 8 is a block diagram of a display device 800 in accordance with an embodiment of the present disclosure. Referring to FIG. 8, the display device 800 includes a display panel 810, a timing controller 820, a gate driver 830, a data driver 840, and a voltage generator 850. The gate driver 830 may take the form of the gate driving circuit 600 or 700 described above with respect to FIGS. 6 and 7, and the first clock line clk, the second clock line clkb, the first scan voltage line vd/s, the second scan voltage line vs/d, the first reference voltage line vdd1, and the second reference voltage line vdd2 that are shown in FIGS. 6 and 7 are omitted in FIG. 8 for convenience of illustration.

The display panel 810 is connected to a plurality of gate lines GL extending in a first direction D1 and a plurality of data lines DL extending in a second direction D2 intersecting (e.g., substantially perpendicular to) the first direction D1. The display panel 810 includes a plurality of pixels (not shown) arranged in a matrix form. Each of the pixels may be electrically connected to a corresponding one of the gate lines GL and a corresponding one of the data lines DL. The display panel 810 can be a liquid crystal display panel, an organic light emitting diode (OLED) display panel, or any other suitable type of display panel.

The timing controller 820 controls the operations of the display panel 810, the gate driver 830, the data driver 840, and the voltage generator 850. The timing controller 820 receives input image data RGBD and an input control signal CONT from an external device (e.g., a host). The input image data RGBD may include a plurality of input pixel data for the plurality of pixels. Each of the input pixel data may include red gradation data R, green gradation data G, and blue gradation data B for a corresponding one of the plurality of pixels. The input control signal CONT may include a main clock signal, a data enable signal, a vertical sync signal, a horizontal sync signal, and the like. The timing controller 820 generates output image data RGBD', a first control signal CONT1, and a second control signal CONT2 based on the input image data RGBD and the input control signal CONT. Implementations of timing controller 820 are known in the art. The timing controller 820 can be implemented in a number of ways (e.g., using dedicated hardware) to perform the various functions discussed herein. A "processor" is an example of a timing controller 820 that employs one or more microprocessors that can be programmed using software (e.g., microcode) to perform the various functions discussed herein. The timing controller 820 can be implemented with or without a processor, and can also be implemented as a combination of dedicated hardware that performs some functions and a processor that performs other functions. Examples of timing controller 820 include, but are not limited to, conventional microprocessors, application specific integrated circuits (ASICs), and field programmable gate arrays (FPGAs).

The gate driver 830 receives the first control signal CONT1 from the timing controller 820. The first control signal CONT1 may include the first and second clock signals transferred via the first and second clock lines clk and clkb shown in FIGS. 6 and 7 and having opposite phases. The gate driver 830 generates a plurality of gate driving signals for output to the gate lines GL based on the first control signal CONT1. The gate driver 830 may sequentially apply the plurality of gate driving signals to the gate lines GL.

The data driver 840 receives the second control signal CONT2 and the output image data RGBD' from the timing controller 820. The data driver 840 generates a plurality of data voltages based on the second control signal CONT2 and the output image data RGBD'. The data driver 840 can apply the generated plurality of data voltages to the data lines DL.

The voltage generator 850 supplies power to the display panel 810, the timing controller 820, the gate driver 830, the data driver 840, and potentially additional components. Specifically, the voltage generator 850 is configured to, under control of the timing controller 820, supply the first scan voltage, the second scan voltage, the first reference voltage, and the second reference voltage that are transferred via the first scan voltage line vd/s, the second scan voltage line vs/d, the first reference voltage line vdd1, and the second reference voltage line vdd2 shown in FIGS. 6 and 7, respectively. The configuration of the voltage generator 850 can be known in the art. In one implementation, the voltage generator 850 may include a voltage converter, such as a DC/DC converter, and a crossbar switch. The voltage converter generates from an input voltage a plurality of output voltages having different voltage levels. The crossbar switch can then selectively couple the output voltages to the first scan voltage line vd/s, the second scan voltage line vs/d, the first reference voltage line vdd1, and the second reference voltage line vdd2 under control of the timing controller 820, so as to supply the required first and second scan voltages and first and second reference voltages. For example, the crossbar is controlled such that a high level voltage generated by the voltage converter is alternately coupled to the first and second reference voltage lines vdd1 and vdd2 at an interval. In some embodiments, the interval can be equal to one or more frame periods.

In embodiments, the gate driver 830 and/or the data driver 840 can be disposed on the display panel 810 or can be connected to the display panel 810 by, for example, a Tape Carrier Package (TCP). For example, the gate driver 830 can be integrated in the display panel 810 as a gate driver on array (GOA) circuit.

Examples of display device 800 include, but are not limited to, cell phones, tablets, televisions, displays, notebook computers, digital photo frames, and navigators.

The foregoing is specific embodiments of the present disclosure and should not be construed as limiting the scope of the present disclosure. Various variations and modifications to the described embodiments can be made by a person skilled in the art without departing from the spirit of the present disclosure, and such variations and modifications are also intended to be encompassed within the scope of the present disclosure.

What is claimed is:

1. A shift register circuit comprising:
an input terminal configured to receive an input pulse;
a reset terminal configured to receive a reset pulse;
a first scan voltage terminal configured to be applied with a first scan voltage;
a second scan voltage terminal configured to receive a second scan voltage;
a first reference voltage terminal configured to receive a first reference voltage;
a second reference voltage terminal configured to receive a second reference voltage;
a clock terminal configured to receive a clock signal;
an output terminal configured to output an output signal;
an input circuit configured to supply the first scan voltage to a first node in response to the input pulse received at the input terminal being active, and to supply the second scan voltage to the first node in response to the reset pulse received at the reset terminal being active;
a first control circuit configured to bring the first reference voltage terminal into conduction with a second node in response to the first reference voltage applied at the first reference voltage terminal being active, to bring the second reference voltage terminal into conduction with the second node in response to the first node being at an active potential, to supply the second reference voltage applied at the second reference voltage terminal to the first node, and bring the second reference voltage terminal into conduction with the output terminal in response to the second node being at the active potential;
a second control circuit configured to bring the second reference voltage terminal into conduction with a third node in response to the second reference voltage applied at the second reference voltage terminal being active, to bring the first reference voltage terminal into conduction with the third node in response to the first node being at the active potential, and to supply the first reference voltage applied at the first reference voltage terminal to the first node and bring the first reference voltage terminal into conduction with the output terminal in response to the third node being at the active potential; and
an output circuit configured to bring the clock terminal into conduction with the output terminal in response to the first node being at the active potential.

2. The shift register circuit of claim 1,
wherein the first control circuit and the second control circuit are configured to operate alternatingly in response to each of the first reference voltage and the second reference voltage switching between an active voltage level and an inactive voltage level at an interval,
wherein the first reference voltage and the second reference voltage have opposite phases.

3. The shift register circuit of claim 1, wherein the input circuit comprises:
a first transistor comprising a first gate connected to the input terminal, a first electrode connected to the first scan voltage terminal, and a second electrode connected to the first node; and
a second transistor comprising a second gate connected to the reset terminal, a third electrode connected to the second scan voltage terminal, and a fourth electrode connected to the first node.

4. The shift register circuit of claim 1, wherein the first control circuit comprises:
a fourth transistor comprising a third gate connected to the second node, a fifth electrode connected to the second reference voltage terminal, and a sixth electrode connected to the output terminal;
a sixth transistor comprising a fourth gate connected to the first reference voltage terminal, a seventh electrode connected to the first reference voltage terminal, and an eighth electrode connected to the second node;
a seventh transistor comprising a fifth gate connected to the first node, a ninth electrode connected to the second reference voltage terminal, and a tenth electrode connected to the second node; and
an eighth transistor comprising a sixth gate connected to the second node, an eleventh electrode connected to the second reference voltage terminal, and a twelfth electrode connected to the first node.

5. The shift register circuit of claim 1, wherein the second control circuit comprises:
a fifth transistor comprising a seventh gate connected to the third node, a thirteenth electrode connected to the first reference voltage terminal, and a fourteenth electrode connected to the output terminal;
a ninth transistor comprising an eighth gate connected to the second reference voltage terminal, a fifteenth electrode connected to the second reference voltage terminal, and a sixteenth electrode connected to the third node;
a tenth transistor comprising a ninth gate connected to the first node, a seventeenth electrode connected to the first reference voltage terminal, and an eighteenth electrode connected to the third node; and
an eleventh transistor comprising a tenth gate connected to the third node, a nineteenth electrode connected to the first reference voltage terminal, and a twentieth electrode connected to the first node.

6. The shift register circuit of claim 1, wherein the output circuit comprises a third transistor comprising an eleventh gate connected to the first node, a twenty-first electrode connected to the clock terminal, and a twenty-second electrode connected to the output terminal.

7. The shift register circuit of claim 6, wherein the output circuit further comprises a capacitor connected between the first node and the output terminal.

8. A gate driver comprising N cascaded shift register circuits as claimed in claim 1, N being an integer greater than or equal to 2,
wherein an output terminal of an m-th one of the N cascaded shift register circuits is connected to an input terminal of an (m+1)-th one of the N cascaded shift register circuits, m being an integer and 1≤m<N, and
wherein an output terminal of an n-th one of the N cascaded shift register circuits is connected to the reset terminal of an (n−1)-th one of the N cascaded shift register circuits, n being an integer and 1<n≤N.

9. A display panel comprising:
a first scan voltage line configured to transfer the first scan voltage;
a second scan voltage line configured to transfer the second scan voltage;
a first reference voltage line configured to transfer the first reference voltage, the first reference voltage switching between an active voltage level and an inactive voltage level at an interval;
a second reference voltage line configured to transfer the second reference voltage, the second reference voltage switching between an active voltage level and an inactive voltage level at the interval, and the first and second reference voltages having opposite phases;
a first clock line configured to transfer a first clock signal;
a second clock line configured to transfer a second clock signal, the first and second clock signals having opposite phases; and
the gate driver comprising N cascaded shift register circuits of claim 1,
wherein first scan voltage terminals of the N cascaded shift register circuits are connected to the first scan voltage line,
wherein second scan voltage terminals of the N cascaded shift register circuits are connected to the second scan voltage line,
wherein first reference voltage terminals of the N cascaded shift register circuits are connected to the first reference voltage line, wherein second reference voltage terminals of the N cascaded shift register circuits are connected to the second reference voltage line, wherein a first clock terminal of, a (2k−1)-th one of the N cascaded shift register circuits is connected to the first clock line, and wherein a second clock terminal of a 2k-th one of the N cascaded shift register circuits is connected to the second clock line, k being a positive integer and 2k≤N.

10. The display panel of claim 9, further comprising:
a timing controller configured to control operation of the display panel, wherein the timing controller is configured to supply the first clock signal and the second clock signal to the first clock line and the second clock line, respectively; and
a voltage generator configured to, under control of the timing controller, supply the first scan voltage, the second scan voltage, the first reference voltage, and the second reference voltage to the first scan voltage line, the second scan voltage line, the first reference voltage line, and the second reference voltage line, respectively.

11. The display device of claim 10, wherein the interval is equal to at least one frame period.

12. A method of driving the shift register circuit as claimed in claim 1, comprising:
supplying the first reference voltage to the first reference voltage terminal, wherein the first reference voltage switches between an active voltage level and an inactive voltage level at an interval;
supplying the second reference voltage to the second reference voltage terminal, wherein the second reference voltage switches between an active voltage level and an inactive voltage level at the interval, the first and second reference voltages having opposite phases; and
based on whether the first reference voltage or the second reference voltage is active, selectively performing, by the first control circuit and the second control circuit, operations comprising:
responsive to the first reference voltage being active, bringing, by the first control circuit, the first reference voltage terminal into conduction with the second node, supplying the second reference voltage to the first node, and bringing the second reference voltage terminal into conduction with the output terminal; and
responsive to the second reference voltage being active, bringing, by the second control circuit, the second reference voltage terminal into conduction with the third node, supplying the first reference voltage to the first node, and bringing the first reference voltage terminal into conduction with the output terminal.

13. The method of claim 12, wherein the first scan voltage has an active voltage level, and wherein the second scan voltage has an inactive voltage level, the method further comprising:
supplying the input pulse to the input terminal such that the input circuit supplies the first scan voltage to the first node in response to the input pulse being active;
bringing, by the first control circuit, the second reference voltage terminal into conduction with the second node in response to the first node being at the active potential;
bringing, by the second control circuit, the first reference voltage terminal into conduction with the third node in response to the first node being at the active potential;
bringing, by the output circuit, the clock terminal into conduction with the output terminal in response to the first node being at the active potential; and
supplying the reset pulse to the reset terminal such that the input circuit supplies the second scan voltage to the first node in response to the reset pulse being active.

14. The method of claim 12, wherein the first scan voltage has an inactive voltage level, and wherein the second scan voltage has an active voltage level, the method further comprising:
supplying the input pulse to the reset terminal such that the input circuit supplies the second scan voltage to the first node in response to the input pulse being active;
bringing, by the first control circuit, the second reference voltage terminal into conduction with the second node in response to the first node being at the active potential;
bringing, by the second control circuit, the first reference voltage terminal into conduction with the third node in response to the first node being at the active potential;
bringing, by the output circuit, the clock terminal into conduction with the output terminal in response to the first node being at the active potential; and
supplying the reset pulse to the input terminal such that the input circuit supplies the first scan voltage to the first node in response to the reset pulse being active.

15. The method of claim 13,
wherein the clock signal has a duty cycle of 50%,
wherein the input pulse has a pulse width equal to a half of a period of the clock signal and is in synchronization with a duration in which the clock signal is inactive, and
wherein the reset pulse has a pulse width equal to the half of the period of the clock signal and is delayed by one period of the clock signal relative to the input pulse.

16. The gate driver of claim 8,
wherein the first control circuit and the second control circuit are configured to operate alternatingly in response to each of the first reference voltage and the second reference voltage switching between an active voltage level and an inactive voltage level at an interval, and
wherein the first reference voltage and the second reference voltage have opposite phases.

17. The gate driver of claim 8 wherein the input circuit comprises:
a first transistor comprising a first gate connected to the input terminal, a first electrode connected to the first scan voltage terminal, and a second electrode connected to the first node; and
a second transistor comprising a second gate connected to the reset terminal, a third electrode connected to the second scan voltage terminal, and a fourth electrode connected to the first node.

18. The gate driver of claim 8, wherein the first control circuit comprises:
a fourth transistor comprising a third gate connected to the second node, a fifth electrode connected to the second reference voltage terminal, and a sixth electrode connected to the output terminal;
a sixth transistor comprising a fourth gate connected to the first reference voltage terminal, a seventh electrode connected to the first reference voltage terminal, and an eighth electrode connected to the second node;
a seventh transistor comprising a fifth gate connected to the first node, a ninth electrode connected to the second reference voltage terminal, and a tenth electrode connected to the second node; and an eighth transistor comprising a sixth gate connected to the second node, an eleventh electrode connected to the second reference voltage terminal, and a twelfth electrode connected to the first node.

19. The gate driver of claim 8, wherein the second control circuit comprises:

a fifth transistor comprising a seventh gate connected to the third node, a thirteenth electrode connected to the first reference voltage terminal, and a fourteenth electrode connected to the output terminal;

a ninth transistor comprising an eighth gate connected to the second reference voltage terminal, a fifteenth electrode connected to the second reference voltage terminal, and a sixteenth electrode connected to the third node;

a tenth transistor comprising a ninth gate connected to the first node, a seventeenth electrode connected to the first reference voltage terminal, and an eighteenth electrode connected to the third node; and an eleventh transistor comprising a tenth gate connected to the third node, a nineteenth electrode connected to the first reference voltage terminal, and a twentieth electrode connected to the first node.

20. The gate driver of claim 8, wherein the output circuit comprises a third transistor comprising an eleventh gate connected to the first node, a twenty-first electrode connected to the clock terminal, and a twenty-second electrode connected to the output terminal.

* * * * *